United States Patent
Xie et al.

(10) Patent No.: US 10,718,490 B2
(45) Date of Patent: *Jul. 21, 2020

(54) LED LAMP BEAD STRUCTURE HAVING QUASI-SOLAR SPECTRUM

(71) Applicant: SHENZHEN KEWEITIAN ECO-LIGHTING CO., LTD., ShenZhen, Guangdong (CN)

(72) Inventors: Rui Xie, Hubei (CN); Liling Lin, Guangdong (CN); Gangcheng Liu, Anhui (CN)

(73) Assignee: Shenzhen Keweitian Eco-Lighting Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/336,081

(22) PCT Filed: Sep. 23, 2016

(86) PCT No.: PCT/CN2016/099796
§ 371 (c)(1),
(2) Date: Mar. 22, 2019

(87) PCT Pub. No.: WO2018/053772
PCT Pub. Date: Mar. 29, 2018

(65) Prior Publication Data
US 2020/0018461 A1    Jan. 16, 2020

(51) Int. Cl.
*F21V 9/02* (2018.01)
*F21V 29/70* (2015.01)
(Continued)

(52) U.S. Cl.
CPC ............... *F21V 9/02* (2013.01); *F21V 29/70* (2015.01); *H01L 25/13* (2013.01); *H01L 33/62* (2013.01);
(Continued)

(58) Field of Classification Search
None
See application file for complete search history.

(56) References Cited

U.S. PATENT DOCUMENTS 6,992,718 B1 *   1/2006   Takahara ............... G02B 23/14
                                                    348/333.09
10,480,750 B2 * 11/2019   Xie ........................... F21S 4/00
(Continued)

FOREIGN PATENT DOCUMENTS

CN          1710725 A      12/2005
CN        101764067 A       6/2010
(Continued)

*Primary Examiner* — Ashok Patel
(74) *Attorney, Agent, or Firm* — Morgan, Lewis & Bockius LLP

(57) ABSTRACT

An LED lamp bead structure having a quasi-solar spectrum, comprising a first polar electrode (10), a plurality of LED chips (20), a plurality of resistors (30) and a circuit board (40); the first polar electrode (10) is in cooperation with the circuit board (40) to package the plurality of LED chips (20) and the plurality of resistors (30); the structure of the first polar electrode (10) is a three-dimensional structure comprising a plurality of planes, which freely simulates the solar spectrum and may take the most advantage of the energy-saving feature of LED semiconductors.

10 Claims, 4 Drawing Sheets

(51) Int. Cl.
  *H01L 33/62* (2010.01)
  *F21Y 107/10* (2016.01)
  *F21Y 113/13* (2016.01)
  *F21Y 115/10* (2016.01)
  *H01L 25/13* (2006.01)

(52) U.S. Cl.
  CPC ....... *F21Y 2107/10* (2016.08); *F21Y 2113/13* (2016.08); *F21Y 2115/10* (2016.08)

(56) References Cited

U.S. PATENT DOCUMENTS

| | | | | |
|---|---|---|---|---|
| 2002/0006040 | A1* | 1/2002 | Kamada | F21V 5/02 |
| | | | | 362/237 |
| 2004/0213017 | A1* | 10/2004 | Chou | G02B 6/0041 |
| | | | | 362/558 |
| 2005/0002608 | A1* | 1/2005 | Nishiyama | G02B 6/43 |
| | | | | 385/31 |
| 2006/0002110 | A1* | 1/2006 | Dowling | F21K 9/00 |
| | | | | 362/249.05 |
| 2009/0135608 | A1* | 5/2009 | Sell | F21S 8/026 |
| | | | | 362/365 |
| 2015/0131290 | A1* | 5/2015 | Speer | H05K 1/189 |
| | | | | 362/285 |
| 2015/0292686 | A1* | 10/2015 | Negley | F21V 3/0625 |
| | | | | 315/34 |
| 2017/0045666 | A1* | 2/2017 | Vasylyev | G02B 6/0018 |

FOREIGN PATENT DOCUMENTS

| | | |
|---|---|---|
| CN | 202205741 U | 4/2012 |
| JP | 2004311621 A | 11/2004 |

\* cited by examiner

B-B

LED LAMP BEAD STRUCTURE HAVING QUASI-SOLAR SPECTRUM

FIELD OF TECHNOLOGY

The present application relates to the field of LED lighting, and particularly to a quasi-solar spectrum LED lamp bead structure.

BACKGROUND

As the fourth generation of lighting source, white-light LED has the advantages of solidification, small volume, low heat generation, low power consumption, long life, fast reaction rate, being environmentally friendly and etc. However, the lighting principle of semiconductor LED determines that a LED chip can only be monochromatic light which cannot be directly used for conventional lighting. Therefore, the existing white-light LED technology usually adopts a white-light LED light source made by exciting the yellow-light phosphor with LED blue-light, and is mainly used in general lighting. Although this white-light LED technology has promoted the application of LED semiconductors in the lighting filed and backlights of electronic products, the health and safety hazards of blue-light to human eyes have been confirmed by the medical community. At the same time, there are some negative reports sometimes that white-light LED lighting harms the health and safety of human eyes in practical applications. In addition, the existing white-light LEDs also encounter various technical bottlenecks due to the phosphors powder used in the production thereof, which hinders the normal development of the white-light LED.

The best reference object for artificial light is undoubtedly the sunlight. It is known that the visible light of the sun is a colorful spectrum naturally composed by the seven color scheme of red, orange, yellow, green, cyan, blue and purple. It is because of the colorfulness and variability of the solar spectrum that the complex and diverse species of the earth have been nurtured, and at the same time, the biological colors are given brilliant and colorful. Therefore, only from the perspective of the humanization that conforms to the laws of natural light, and using the lamp as the carrier to achieve the technical height where solar spectrum is arbitrary and artificially simulated, can the LED semiconductor lighting source be truly utilized and thus beneficial to human.

Therefore, one of the technical problems that need to be solved urgently now is how to abandon the manufacturing technology and process that the LED blue-light excites the yellow-light phosphor, so that the blue-light component in the lighting spectrum is minimal, thereby providing a quasi-solar spectrum LED lamp bead structure that can ensure the health and safety of human eyes, achieve the intelligent adjustment according to actual needs, arbitrarily simulate solar spectrum, and has a wide application range.

SUMMARY

In order to solve the technical problems above, the present application provides a quasi-solar spectrum LED lamp bead structure, including a first polarity electrode, a plurality of LED chips, a plurality of resistors and a circuit board;

wherein the first polarity electrode cooperates with the circuit board for encapsulating the plurality of LED chips and the plurality of resistors;

the first polarity electrode has a three-dimensional structure including a plurality of planes;

each of the LED chips is respectively mounted on a corresponding plane; one end of each of the resistors is connected to a corresponding soldering point on the circuit board, and each of the soldering points is connected to a pole on a lighting plane of a corresponding LED chip; the other end of each of the resistors is connected to a second polarity electrode; the other pole of the LED chip is connected to the first polarity electrode;

wherein the first polarity electrode and the second polarity electrode have opposite polarities, and the resistors are variable resistors or fixed resistors;

the first polarity electrode has a design structure based on a semi-cylindrical surface, and has a plurality of planes thereon; a connecting line of a center point of each of the planes with a circle center of the semi-cylindrical surface is respectively perpendicular to each of the corresponding planes; or, the first polarity electrode has a design structure based on a hemispherical surface, and has a plurality of planes thereon; two apex angles below the plurality of planes are connected to each other to form a regular polygon, a plane where the regular polygon is located is parallel to a plane of the hemispherical surface, and the two apex angles below each of the planes are both located on the hemispherical surface, two apex angles above the plurality of planes are both on a spherical surface of the plane of the hemispherical surface intersecting with the hemispherical surface; connecting lines of center points of the plurality of planes with a sphere center of the hemispherical surface are respectively perpendicular to each of the corresponding planes; or, the first polarity electrode has an arbitrary-shaped three-dimensional structure including the plurality of planes; the arbitrarily-shaped three-dimensional structure is an arbitrarily structure that does not block light emitted by the LEDs on the planes from continuing to illuminate outwards after being focused and mixed at an intersection point, and is neither a semi-cylindrical surface design structure nor a hemispherical surface design structure; connecting lines of center points of the plurality of planes with the intersection point are respectively perpendicular to the corresponding planes.

Alternatively, a region of the first polarity electrode surrounding the lighting plane of the LED chip is provided with a polygonal flange plate;

a material of the first polarity electrode is metal;

the circuit board is arranged on the flange plate, and is connected to the flange plate through an adhesive.

Alternatively, the other end of the lighting region of the LED chip of the first polarity electrode is provided with a cylindrical body;

the cylindrical body is sleeved with a heat sink, and thermally conductive adhesives are provided between the cylindrical body and the heat sink and between the flange plate and the heat sink.

Alternatively, the quasi-solar spectrum LED lamp bead structure further includes a plurality of soldering pieces;

each of the soldering pieces is respectively mounted on one of the corresponding planes; each of the LED chips is respectively mounted on one of the corresponding soldering pieces.

Alternatively, a central portion of each of the planes of the first polarity electrode is provided with a encapsulation groove for accommodating the soldering piece and the LED chip, and a depth of the encapsulation groove is greater than or equal to a thicknesses sum of the soldering piece and the LED chip, a size of the encapsulation groove is greater than a size of the LED chip and a size of the soldering piece;

when the first polarity electrode is the structure based on a semi-cylindrical surface, a connecting line of a center point of a bottom plane of the encapsulation groove with a circle center of the semi-cylindrical surface of the first polarity electrode is perpendicular to the bottom plane of the encapsulation groove;

when the first polarity electrode is the structure based on a hemispherical surface, a connecting line of the center point of the bottom plane of the encapsulation groove with a sphere center of the hemispherical surface is perpendicular to the bottom plane of the encapsulation groove;

when the first polarity electrode is the arbitrary-shaped three-dimensional structure, a connecting line of the center point of the bottom plane of the encapsulation groove with the intersection point is perpendicular to the bottom plane of the encapsulation groove;

wherein the soldering pieces and the LED chips are sequentially mounted in the encapsulation groove.

Alternatively, a central portion of each of the planes of the first polarity electrode is provided with a encapsulation blind hole for accommodating the soldering piece and the LED chip, and a depth of the encapsulation blind hole is smaller than or equal to a thicknesses sum of the soldering piece and the LED chip, a size of the encapsulation blind hole is greater than a size of the accommodated LED chip and a size of the accommodated soldering piece;

when the first polarity electrode is the structure based on a semi-cylindrical surface, a connecting line of a center point of a bottom plane of the encapsulation blind hole with the circle center of the semi-cylindrical surface of the first polarity electrode is perpendicular to the bottom plane of the encapsulation blind hole;

when the first polarity electrode is the structure based on a hemispherical surface, a connecting line of the center point of the bottom plane of the encapsulation blind hole with the sphere center of the hemispherical surface is perpendicular to the bottom plane of the encapsulation blind hole;

when the first polarity electrode is the arbitrary-shaped three-dimensional structure, a connecting line of the center point of the bottom plane of the encapsulation blind hole with the intersection point is perpendicular to the bottom plane of the encapsulation blind hole;

wherein the soldering piece and the LED chip are sequentially mounted in the encapsulation blind hole.

Alternatively, a shape of the soldering piece is the same as a shape of the corresponding LED chip;

a size of the soldering piece is smaller, or equal to, or greater than a size of the corresponding LED chip.

Alternatively, the circuit board is provided with a through hole having a stepped structure, or a notch having other predetermined shapes;

the plurality of resistors are located on a first stepped surface of the stepped structure, and the soldering points are located on a second stepped surface of the stepped structure.

Alternatively, the quasi-solar spectrum LED lamp bead structure further includes a multi-component adhesive;

the multi-component adhesive is configured to heat and solidify the connecting line of the LED chip with the first polarity electrode, the connecting line of the LED chip with the soldering point on the second stepped surface of the circuit board, and the soldering point.

Alternatively, the multi-component adhesive is filled to a horizontal position that does not exceed a first stepped surface of the circuit board.

Alternatively, light of multiple colors emitted by the plurality of LED chips is focused and mixed at an intersection point to generate a spectrogram of a quasi-solar spectrum LED lamp bead that can alleviate visual fatigue and prevent myopia; in the spectrogram, a main peak wave length minimum value is 535 nm, a main peak wave length maximum value is 565 nm, and a main peak wave length central value is 550 nm; a wave band radiation flux of wave lengths 520 nm-580 nm is 37% greater than that of wave lengths 380 nm-780 nm; a wave band radiation flux of wave lengths 380 nm-480 nm is 25% smaller than that of wave lengths 380 nm-780 nm.

The quasi-solar spectrum LED lamp bead structure of the present application subverts the existing white-light LED manufacturing technology and process, abandons the technology that the white-light LED is manufactured by blue-light LED exciting yellow-light phosphor, and solves the problem that a lot of blue-light components cause health hazards to human body in the existing white-light LED manufacturing technology. Meanwhile, the present application achieves arbitrarily simulating solar spectrum so as to meet the needs of the growth and metabolism of creatures in the originally ecological light environment, and meets the vision of broad applications of ecological and intelligentized lighting in various fields in the future. The present application can maximize the energy-saving characteristics of LED semiconductors, achieve good color rendering properties and visual effects, and can be applied to various lighting fields, agriculture and animal husbandry fields, new energy fields where microorganisms are cultivated massively, backlight fields of electronic products and etc.

BRIEF DESCRIPTION OF THE DRAWINGS

In order to more clearly describe the technical solutions of the present application or in the prior art, the drawings to be used in describing the embodiments or the prior art will be briefly described below. Obviously, the drawings in the following description are some embodiments of the present application; for those of ordinary skill in the art, other drawings may also be obtained based on these drawings without any creative work.

DETAILED DESCRIPTION

In order to make the objectives, technical solutions, and advantages of the present application clearer, the technical solutions in the present application will be described clearly and fully with reference to the accompanying drawings hereinafter. Obviously, the described embodiments are merely some but not all of the embodiments of the present application. On the basis of the embodiments of the present application, all other embodiments obtained by the person of ordinary skill in the art without creative work shall fall within the protection scope of the present application.

Figure 1:
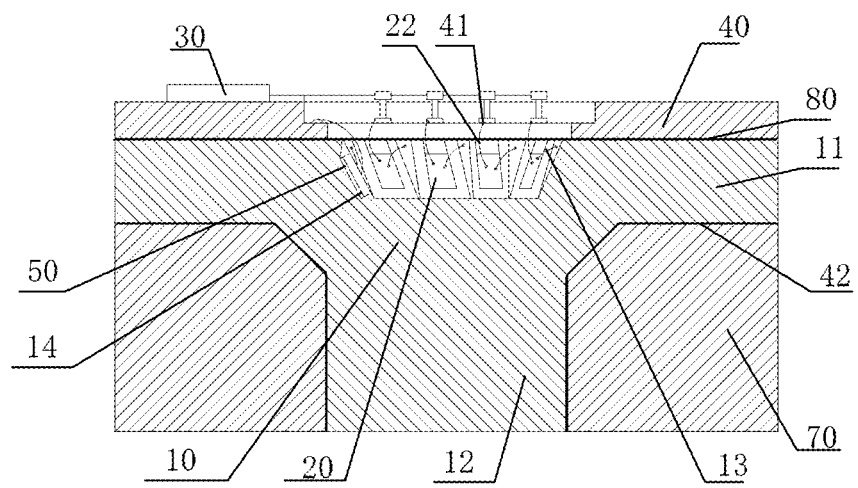
FIG. 1 is an assembling diagram of the quasi-solar spectrum LED lamp bead structure according to an embodiment of the present application.

FIG. 1 is an assembling diagram of the quasi-solar spectrum LED lamp bead structure according to an embodiment of the present application. As shown in FIG. 1, the quasi-solar spectrum LED lamp bead structure includes a first polarity electrode 10 for three-dimensional integrated encapsulation, a plurality of LED chips 20, a plurality of resistors 30 and a circuit board 40, wherein:

the first polarity electrode 10 cooperates with the circuit board 40 for encapsulating the plurality of LED chips 20 and the plurality of resistors 30;

wherein the first polarity electrode and the second polarity electrode have opposite polarities. Specifically, the first polarity electrode 10 may be a negative electrode for three-dimensional integrated encapsulation, and the second polarity electrode may be a positive electrode that have the opposite polarity; on the contrary, the second polarity electrode is a negative electrode when the first polarity electrode is a positive electrode for three-dimensional integrated encapsulation.

the first polarity electrode 10 above is a three-dimensional structure including a plurality of planes, each of soldering pieces is respectively mounted on a corresponding plane; each of the LED chips 20 is respectively mounted on a corresponding soldering piece; one end of each of the resistors 30 is connected to a corresponding soldering point 41 on the circuit board 40, and each of the soldering points 41 is connected to a pole on a lighting plane of a corresponding LED chip; the other end of each of the resistors 30 is connected to a second polarity electrode; the other pole (such as the other pole on the lighting plane or on the substrate) of each of the LED chip is connected to the first polarity electrode.

Preferably, the circuit board 40 may be a PCB (Printed Circuit Board) to be used as an electrical connection carrier for the quasi-solar spectrum LED lamp bead structure of the present embodiment.

It should be noted that, the resistor above may be a variable resistor or a fixed resistor. Specifically, at the debugging stage, the plurality of resistors can be a plurality of variable resistors; while at the mass production stage, the plurality of resistors can be fixed resistors. By changing the resistance values of the plurality of resistors, the currents passing the corresponding LED chips can be changed, therefore the radiation flux of each of the LEDs is changed, so as to control the proportion of each monochromatic light in the mixed light, thereby changing the spectrum of the mixed light. In this way, it is possible to respectively produce quasi-solar spectrum LED lamp beads having different band spectra, which are suitable for the living and metabolism of various organisms.

Wherein, as a preferred embodiment, the first polarity electrode 10 may be a structure based on a semi-cylindrical surface, and has a plurality of planes thereon; and a connecting line of a center point of each of the planes with a circle center of the semi-cylindrical surface is respectively perpendicular to each of the corresponding planes;

In addition, as another preferred embodiment, the first polarity electrode 10 may be a structure based on a hemispherical surface, and has a plurality of planes thereon; two apex angles below the plurality of planes are connected to each other to form a regular polygon, a plane where the regular polygon is located is parallel to a plane of the hemispherical surface, and the two apex angles below each of the planes are both located on the hemispherical surface, two apex angles above the plurality of planes are both on a spherical surface of the plane of the hemispherical surface intersecting with the hemispherical surface; and connecting lines of center points of the plurality of planes with a sphere center of the hemispherical surface are respectively perpendicular to each of the corresponding planes;

In addition, as the third preferred embodiment, the first polarity electrode 10 may be an arbitrary-shaped three-dimensional structure including the plurality of planes; the arbitrarily-shaped three-dimensional structure is an arbitrarily structure that does not block light emitted by the LEDs on the planes from continuing to illuminate outwards after being focused and mixed at an intersection point, and is neither a semi-cylindrical surface design structure nor a hemispherical surface design structure; and connecting lines of center points of the plurality of planes with the intersection point are respectively perpendicular to the corresponding planes.

The quasi-solar spectrum LED lamp bead structure of the present application subverts the existing white-light LED manufacturing technology and process, abandons the prior art that the white-light LED is manufactured by blue-light LED exciting yellow-light phosphor, and solves the problem that a lot of blue-light components cause health hazards to human body in the existing white-light LED manufacturing technology. Meanwhile, the present application achieves arbitrarily simulating solar spectrum so as to meet the needs of the growth and metabolism of creatures in the originally ecological light environment, and meets the vision of broad applications of intelligentized lighting in various fields in the future. The quasi-solar spectrum LED lamp bead structure of the present application can achieve good color rendering properties and visual effects, and can be applied to various lighting fields, agriculture and animal husbandry fields, new energy fields where microorganisms are cultivated massively, backlight fields of electronic products and etc.

In addition, as shown in FIG. 1, as a preference of the embodiments above, a region of the first polarity electrode 10 surrounding the lighting plane of the LED chip is provided with a polygonal flange plate 11;

the material of the first polarity electrode 10 is metal copper (or aluminum or Kovar material);

The PCB circuit board is arranged on the flange plate 11, and the circuit board is connected to a surface of the flange plate 11 through an adhesive 80.

In addition, as a preference of each of the embodiments above, the quasi-solar spectrum LED lamp bead structure of the present embodiment may further include a plurality of soldering pieces 50;

each of the soldering pieces 50 is respectively mounted on one of the corresponding planes; each of the LED chips 20 is respectively mounted on one of the corresponding soldering pieces 50.

Preferably, the material of the soldering piece is an environmentally friendly lead-free alloy material having a melting point of less than 300° C.

In addition, as a preference of each of the embodiments above, the other end of a lighting region of the LED chip of the first polarity electrode 10 is provided with a cylindrical body 12;

the cylindrical body 12 is sleeved with a heat sink 70, and thermally conductive adhesives 42 are provided between the cylindrical body 12 and the heat sink 70 and between the flange plate 11 and the heat sink 70.

It is to be appreciated that, when the power of the LED chip is small, the first polarity electrode 10 for three-dimensional integrated encapsulation may not be provided with the cylindrical body, and the heat sink is not required.

In addition, as a preference of each of the embodiments above, a central portion of each of the planes of the first polarity electrode 10 is provided with a encapsulation groove 14 for accommodating the soldering piece and the LED chip, and a depth of the encapsulation groove 14 is greater than or equal to a thicknesses sum of the soldering piece and the LED chip, a size of the encapsulation groove 14 is (slightly) greater than a size of the accommodated LED chip and a size of the accommodated soldering piece;

when the first polarity electrode is the structure based on a semi-cylindrical surface, a connecting line of a center point of a bottom plane of the encapsulation groove with a circle center of the semi-cylindrical surface of the first polarity electrode is perpendicular to the bottom plane of the encapsulation groove;

when the first polarity electrode is the structure based on a hemispherical surface, a connecting line of the center point of the bottom plane of the encapsulation groove with a sphere center of the hemispherical surface is perpendicular to the bottom plane of the encapsulation groove;

when the first polarity electrode is the arbitrary-shaped three-dimensional structure, a connecting line of the center point of the bottom plane of the encapsulation groove with the intersection point of the structure is perpendicular to the bottom plane of the encapsulation groove;

wherein the soldering pieces and the LED chips are sequentially mounted in the encapsulation groove. Each of the LED lighting planes faces the sphere center, the connecting lines of the center points of the lighting planes of each of the LED chips with the sphere center (the intersection point) of the hemispherical surface are respectively perpendicular to the corresponding LED lighting plane. And then it is heated to solder.

As an alternative embodiment of the encapsulation groove above, a central portion of each of the planes of the first polarity electrode may be provided with a encapsulation blind hole for accommodating the soldering piece and the LED chip, and a depth of the encapsulation blind hole is smaller than or equal to the thicknesses sum of the soldering piece and the LED chip, a size of the encapsulation blind hole is (slightly) greater than the size of the accommodated LED chip and the size of the accommodated soldering piece;

when the first polarity electrode is the structure based on a semi-cylindrical surface, a connecting line of a center point of a bottom plane of the encapsulation blind hole with the circle center of the semi-cylindrical surface of the first polarity electrode is perpendicular to the bottom plane of the encapsulation blind hole;

when the first polarity electrode is the structure based on a hemispherical surface, a connecting line of the center point of the bottom plane of the encapsulation blind hole with the sphere center of the hemispherical surface is perpendicular to the bottom plane of the encapsulation blind hole;

when the first polarity electrode is the arbitrary-shaped three-dimensional structure, a connecting line of the center point of the bottom plane of the encapsulation blind hole with the intersection point of the structure is perpendicular to the bottom plane of the encapsulation blind hole;

In addition, the LED chips are fixed by heating to solder.

It is to be appreciated that, in order to achieve a better soldering effect, a shape of the soldering piece is the same as that of the corresponding LED chip, and a size of the soldering piece is smaller than, or greater than, or equal to a size of the corresponding LED chip.

In addition, as shown in FIG. 1, as a preference of the embodiments above, the circuit board may further be provided with a through hole having a stepped structure, or a notch having other predetermined shapes; the plurality of resistors are on the first stepped surface (such as the upper stepped surface shown in FIG. 1) of the stepped structure, and the soldering points are on the second stepped surface (such as the lower stepped surface shown in FIG. 1) of the stepped structure.

In the embodiments above, the quasi-solar spectrum LED lamp bead structure further includes a multi-component adhesive for heating and solidifying the connecting line 13 of the LED chip with the first polarity electrode, the connecting line 22 of the LED chip with the soldering point of the circuit board, and the soldering point 41.

It should be noted that, the multi-component adhesive above is filled to a horizontal position that does not exceed a first stepped surface of the circuit board.

Compared with other existing heating and solidifying processes, the present embodiment can not only reduce the processing cost of the LED lamp bead, but also simplify the processing process.

Alternatively, the multi-component adhesive is, for example, an AB glue.

It is to be appreciated that, the plurality of LED chips correspond to the resistors having different resistance values. After connecting the circuit and turning on the power, the light in different colors emitted by the LED chips having different wave lengths is focused and mixed at the sphere center of the hemispherical surface so as to form a tapered surface light source. By adjusting the resistance value of each of the resistors respectively so as to change the currents of the plurality of LED chips respectively, the proportions of various lights in the mixed light can be changed and the needed quasi-solar LED spectrum is obtained.

Figure 2:
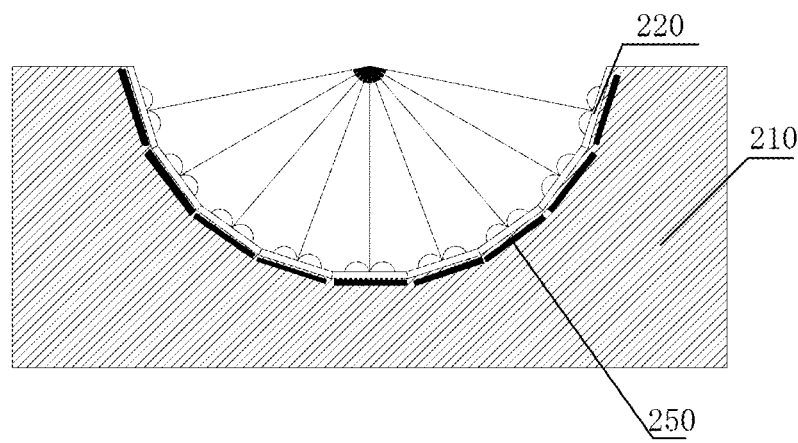
FIG. 2 is a diagram of the LED structure in the quasi-solar spectrum LED lamp bead structure according to an embodiment of the present application.

Specifically, FIG. 2 is a diagram of the LED structure in the quasi-solar spectrum LED lamp bead structure according to an embodiment of the present application. As shown in FIG. 2, the first polarity electrode (such as a negative electrode) 210 for three-dimensional integrated encapsulation is the structure based on a semi-cylindrical surface, and has a plurality of planes thereon. The connecting line of the center point of each of the planes with the circle center of the semi-cylindrical surface is respectively perpendicular to each of the corresponding planes. A plurality of soldering pieces 250 are respectively mounted on each of the corresponding planes and a plurality of LED chips 220 are respectively mounted on each of the corresponding soldering pieces. The lighting planes of the plurality of the LED chips face the circle center of the semi-cylindrical surface respectively, the connecting lines of the center points of the lighting planes of each of the LED chips with the circle center of the semi-cylindrical surface are respectively perpendicular to a corresponding lighting plane, and intersects at the circle center of the semi-cylindrical surface. The light in different colors emitted by the plurality of the LED chips is focused and mixed at the circle center of the semi-cylindrical surface electrode to form a fan-shaped surface light source.

It is to be appreciated that, the plurality of LED chips correspond to the resistors having different resistance values. After connecting the circuit and turning on the power, the light in different colors emitted by the LED chips having different wave lengths is focused and mixed at the circle center of the semi-cylindrical surface so as to form a fan-shaped surface light source. By adjusting the resistance value of each of the resistors respectively so as to change the currents of the plurality of LED chips respectively, the proportions of various lights in the mixed light can be changed and the needed quasi-solar LED spectrum is obtained.

In addition, as another alternative embodiment, the first polarity electrode may also be a structure based on a hemispherical surface, and has a plurality of planes thereon; two apex angles below the plurality of planes are connected to each other to form a regular polygon, the plane where the regular polygon is located is parallel to the plane of the hemispherical surface, and the two apex angles below each of the planes are both located on the hemispherical surface, two apex angles above the plurality of planes are both on the spherical surface of the plane of the hemispherical surface intersecting with the hemispherical surface.

The connecting lines of the center points of the plurality of planes with the sphere center of the hemispherical surface are respectively perpendicular to each of the corresponding planes.

Figure 3:
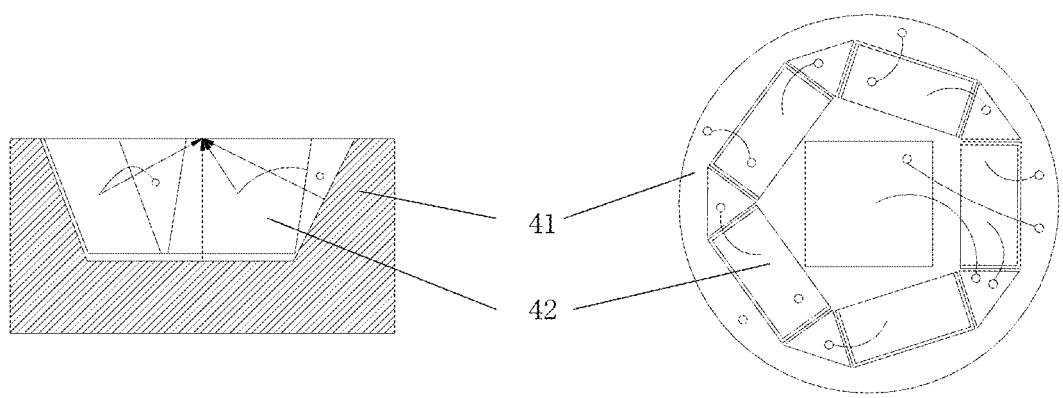
FIG. 3 is a diagram of the LED structure in the quasi-solar spectrum LED lamp bead structure according to another embodiment of the present application.

Specifically, FIG. 3 is a diagram of the LED structure in the quasi-solar spectrum LED lamp bead structure according to another embodiment of the present application. As shown in FIG. 3, the LED structure of the present embodiment includes a negative electrode 41 for three-dimensional integrated encapsulation which is a structure based on a hemispherical surface, a plurality of LED chips 42 having different wave lengths (as shown in FIG. 3, there are 6 LED chips including an LED chip provided at the central portion of the bottom of the electrode).

The negative electrode 41 for three-dimensional integrated encapsulation is a structure based on a hemispherical surface, and has a plurality of planes thereon; two apex angles below the plurality of planes are connected to each other to form a regular polygon, the plane of the regular polygon is parallel to the plane of the hemispherical surface, and the two apex angles below the regular polygon are both designed on the hemispherical surface; two apex angles above the plurality of planes are both designed on a hemispherical surface of the plane of the hemispherical surface intersecting with the hemispherical surface; connecting lines of the center point of each of the planes with the sphere center of the hemispherical surface are respectively perpendicular to each of the corresponding planes. The soldering pieces and the plurality of LED chips are sequentially mounted each of the planes, respectively, wherein each of the planes is mounted with a soldering piece and an LED chip; the lighting planes of the plurality of LED chips face the sphere center of the hemispherical surface. The light in different colors emitted by the plurality of LED chips is focused and mixed at the sphere center of the hemispherical surface to form a tapered surface light source.

Similarly, the plurality of LED chips of the present embodiment correspond to the resistors having different resistance values. After connecting the circuit and turning on the power, the light in different colors emitted by the LED chips having different wave lengths is focused and mixed at the sphere center of the hemispherical surface so as to form a tapered surface light source. By adjusting the resistance value of each of the resistors respectively so as to change the currents of the plurality of LED chips respectively, the proportions of various lights in the mixed light can be changed and the needed quasi-solar LED spectrum is obtained.

In addition, as another preferred embodiment, the first polarity electrode may also be an arbitrary-shaped three-dimensional structure including the plurality of planes; the connecting lines of the center points of the plurality of planes with the intersection point are respectively perpendicular to the corresponding planes.

Figure 4:
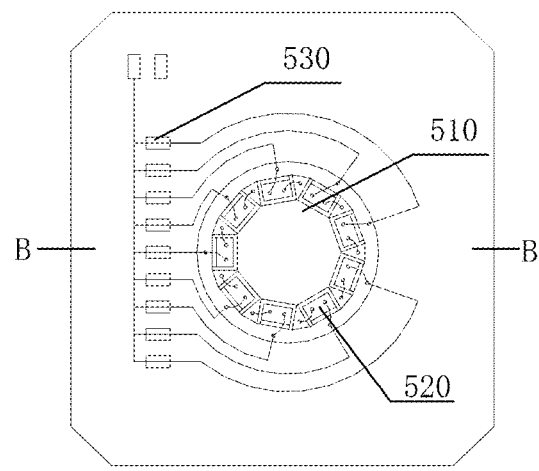
FIG. 4 is a top view of the quasi-solar spectrum LED lamp bead structure according to an embodiment of the present application.
Figure 5:
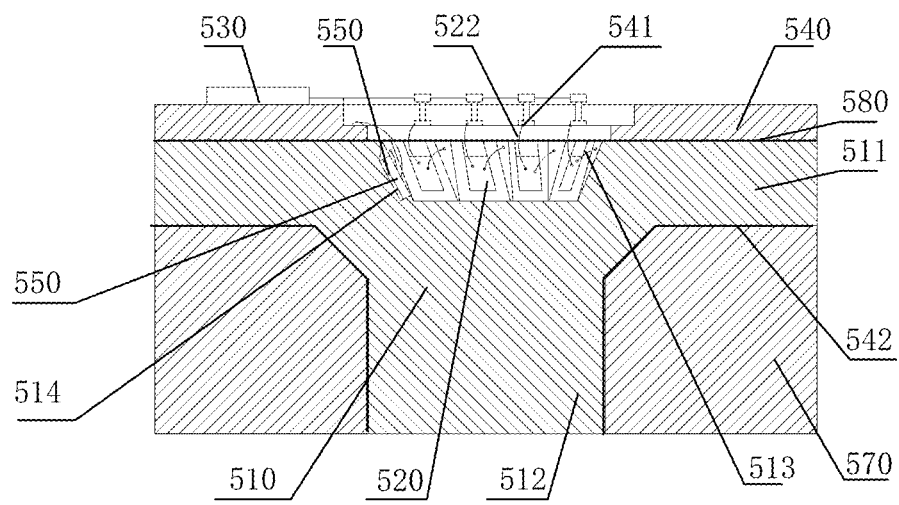
FIG. 5 is a B-B section view of the quasi-solar spectrum LED lamp bead structure according to the embodiment shown in FIG. 4 of the present application.

In addition, FIG. 4 is a top view of the quasi-solar spectrum LED lamp bead structure according to another embodiment of the present application; FIG. 5 is a B-B section view of the quasi-solar spectrum LED lamp bead structure according to the embodiment shown in FIG. 4. As shown in FIG. 4 and FIG. 5, the quasi-solar spectrum LED lamp bead structure of the present embodiment includes a first polarity electrode (such as a positive electrode) 510 for three-dimensional integrated encapsulation, a plurality of LED chips 520, a PCB board 540 of a stepped structure for three-dimensional integrated encapsulation, and resistors 530, soldering pieces 550 and heat sinks 570 corresponding to each of the LED chips.

In order to provide a quasi-solar LED spectrum suitable for the growth of plants, the positive electrode 510 for three-dimensional integrated encapsulation of the quasi-solar spectrum LED lamp bead structure of the present embodiment is designed to be a structure based on a hemispherical surface, and adopts 9 LED chips having different wave lengths.

Specifically, the positive electrode 510 for three-dimensional integrated encapsulation is designed to be a structure based on a hemispherical surface, and 9 planes are machined thereon. The connecting line of the center point of each of the planes with the sphere center of the hemispherical surface is respectively perpendicular to the corresponding planes. Rectangular grooves 514 for mounting the soldering piece and the LED chip are respectively machined with the center points of the plurality of planes as the center. The depth of the rectangular groove 514 is slightly smaller than the depth sum of the soldering piece 550 and the LED chip 520, and the size of the rectangular groove is (slightly) greater than the sizes of the accommodated soldering piece and LED chip.

The plurality of soldering pieces 550 are respectively mounted in the rectangular grooves 514 on the corresponding planes, the plurality of LED chips 520 are respectively mounted on each of the corresponding soldering pieces, and the lighting planes of the plurality of LED chips 520 face the sphere center of the hemispherical surface. The LED chips 520 are connected to the positive electrode 510 by heating to solder.

Wherein the connecting lines of the center points of the lighting planes of the plurality of LED chips 520 with the sphere center of the hemispherical surface are respectively perpendicular to each of the corresponding LED lighting planes, and are focused and mixed at the sphere center of the hemispherical surface; the material of the positive electrode 510 having the first polarity is metal copper (or steel or aluminum); and the PCB board 540 having the steeped structure is bonded to the flange plate 511 of the positive electrode 510 for three-dimensional integrated encapsulation through adhesive 580.

It should be noted that the PCB board above has a design principle that the light emitted by the 9 LED chips is not blocked from continuing to illuminate outwards after being focused and mixed at the intersection point.

570 and the flange plate 511 as well as between the heat sink 570 and the cylindrical body 512, for adhesion.

For example, the wave lengths, powers and sizes of the 9 LED chips with different specifications of the present embodiment, the corresponding sizes of the soldering pieces, the sizes of the encapsulation rectangular grooves machined on the positive electrode 510, and the plurality of corresponding resistors are shown in the following table I.

TABLE I

Design Parameters of the Quasi-solar Spectrum LED Lamp Bead Structure Suitable for the Growth of Plants

| LED | LED 11 | LED 12 | LED 13 | LED 14 | LED 15 |
|---|---|---|---|---|---|
| Wave length (nm) | 661 | 636 | 614 | 558 | 565 |
| Power W) | 0.5 | 0.2 | 0.2 | 0.5 | 0.2 |
| Size (mm) | 0.931 * 0.931 | 0.3675 * 0.735 | 0.49 * 0.49 | 0.931 * 0.931 | 0.49 * 0.49 |
| Soldering piece size (mm) | 0.93 * 0.93 | 0.367 * 0.735 | 0.49 * 0.49 | 0.93 * 0.93 | 0.49 * 0.49 |

|  | HL11 | HL12 | HL13 | HL14 | HL15 |
|---|---|---|---|---|---|
| Resistor | R11 | R12 | R13 | R14 | R15 |
| Groove number | 1 | 2 | 3 | 4 | 5 |
| Groove size (mm) | 0.937 * 0.937 | 0.372 * 0.740 | 0.495 * 0.495 | 0.937 * 0.937 | 0.495 * 0.495 |

|  | LED | LED 16 | LED 17 | LED 18 | LED 19 |
|---|---|---|---|---|---|
| Wave length (nm) |  | 596 | 437 | 461 | 518 |
| Power W) |  | 0.2 | 0.5 | 0.2 | 0.2 |
| Size (mm) |  | 0.49 * 0.49 | 0.931 * 0.931 | 0.3675 * 0.735 | 0.49 * 0.49 |
| Soldering piece size (mm) |  | 0.49 * 0.49 | 0.93 * 0.93 | 0.367 * 0.735 | 0.49 * 0.49 |

|  | HL16 | HL17 | HL18 | HL19 |
|---|---|---|---|---|
| Resistor | R16 | R17 | R18 | R19 |
| Groove number | 6 | 7 | 8 | 9 |
| Groove size (mm) | 0.495 * 0.495 | 0.937 * 0.937 | 0.372 * 0.740 | 0.495 * 0.495 |

The plurality of resistors 530 are encapsulated on the first stepped of the PCB board 540.

One ends of the plurality of resistors are jointly connected to the negative pole of the power source, and the other ends of the plurality of resistors are respectively connected to the soldering points arranged on the second stepped of the PCB board; the soldering points are respectively connected to the negative pole of the lighting plane of the corresponding LED chip; the positive poles of the plurality of LED chips 520 (on the lighting plane or on the substrate) are connected to the positive electrode 510;

The heat sinks 570 may be sleeved on a cylindrical body 512 of the positive electrode 510.

As a preference of the present embodiment, thermally conductive adhesive 542 may be used between the heat sink As shown in FIG. 4 and FIG. 5, the positive electrode 510 of the present embodiment is designed on the basis of a hemispherical surface, the bottom thereof is not provided with chips, therefore n=9.

The sizes of the 9 chips are smaller than $(1 \times 1)$ mm$^2$, therefore the 9 encapsulation planes are designed according to L+M=1 mm (wherein L is a side size of the LED chip, M is an interval between two adjacent LED chips). In addition, according to the different size of each of the LED chips, the corresponding encapsulation rectangular grooves are respectively machined with the center points of the corresponding 9 encapsulation planes as the centers, and according to the following Equation (1), the sphere radius can be calculated as equal to 1.7457 mm, the distance from the center point of the encapsulation plane to the regular nonagon plane at the bottom is 0.4771 mm, the angles of the 9 encapsulation planes with the regular nonagon plane at the bottom are 107.3916 degree. Wherein the sphere radius equation on the design basis of the hemispherical surface is as follows:

$$Ra = \frac{1}{2}(L+M)\sqrt{\frac{1}{4}\left[\tan\frac{90°(n-2)}{n} + \sqrt{\left(\tan\frac{90°(n-2)}{n}\right)^2 + 8}\right]^2 + 1} \quad (1)$$

Wherein Ra is the sphere radius on the design basis of the hemispherical surface; L is the side size of the LED chip; M is the interval between two adjacent LED chips; n is the number of the LED chips (n≥3).

9 encapsulation rectangular grooves 514 for mounting the soldering piece and the LED chip are respectively machined on each of the planes of the positive electrode 510 with the center point as the center according to different chip sizes. The depths of the 9 encapsulation rectangular groove are slightly smaller than the thickness sum of the soldering piece and the LED chip, and the length and width sizes of the 9 encapsulation rectangular grooves are respectively (slightly) greater than the sizes of the accommodated LED chip and soldering piece.

Meanwhile, the positive electrode 510 for three-dimensional integrated encapsulation is further provided with a flange plate (a square flange plate is preferred) 511 for encapsulation, positioning and heat dissipation, and a cylindrical body 512 for connecting the heat sink. The material of the positive electrode 510 for three-dimensional integrated encapsulation is metal copper (or steel or aluminum).

The soldering pieces HL11-HL19 are respectively mounted in the corresponding encapsulation rectangular grooves on the positive electrodes 510 according to the sizes thereof. The 9 soldering pieces are mounted with 9 LED chips 520 matching the shapes thereof correspondingly, and the lighting plane of each of the LED chips faces the sphere center of the hemispherical surface. The connecting lines of the center points of the lighting planes of the 9 LED chips with the sphere center (intersection point) of the hemispherical surface are respectively perpendicular to the corresponding LED lighting planes, so as to be processed by heating to solder.

Similar to the embodiment shown in FIG. 1, the PCB board of the present embodiment is also encapsulated on the square flange plate, and has through holes with stepped structure, wherein the shape and position of the through hole are designed under a principle that the light emitted by the 9 LED chips is not blocked from continuing to illuminate outwards after being focused and mixed at the intersection point.

The PCB board 540 is arranged on the flange plate 511, and the PCB board 540 is connected to the surface of the flange plate 511 through the adhesive 580.

The 9 resistors R11-R19 are encapsulated on the first stepped surface of the PCB board, one ends of the 9 resistors are jointly connected to the negative pole of the power source, and the other ends of the 9 resistors are respectively conducted to the soldering points arranged on the second stepped surface of the PCB board; the soldering points are respectively connected to the negative poles of the lighting planes of the corresponding LED chips 520.

And the positive poles (on the lighting plane or on the substrate) of the 9 LED chips 520 are connected to the positive electrode 510.

Preferably, the heat sink 570 is sleeved on the cylindrical body 512 of the positive electrode 510, and thermally conductive adhesive 542 are used between the heat sink 570 and the flange plate 511 as well as between the heat sink 570 and the cylindrical body 512, for adhesion.

In addition, the connecting lines 513 of the positive poles of the LED chips with the positive electrode for three-dimensional integrated encapsulation, the connecting lines 522 of the negative poles of the LED chips with the soldering points on the second stepped surface of the PCB board, and the soldering points 541 are fixed by pouring AB glue, wherein the AB glue may be arranged to fill until the horizontal position of the first stepped surface of the PCB board 540 for heating and solidification.

In addition, after connecting the circuit and turning on the power, the light in 9 different colors emitted by the LED chips LED11-LED19 having 9 different wave lengths is focused and mixed at the sphere center of the hemispherical surface to form a tapered surface light source.

By adjusting the resistance values of the resistors R11-R19 respectively, the currents of LED11-LED19 can be changed correspondingly, thereby changing the mixing ratios of the 9 kinds of light, and obtaining a quasi-solar LED spectrum suitable for the growth of plants.

Figure 6:
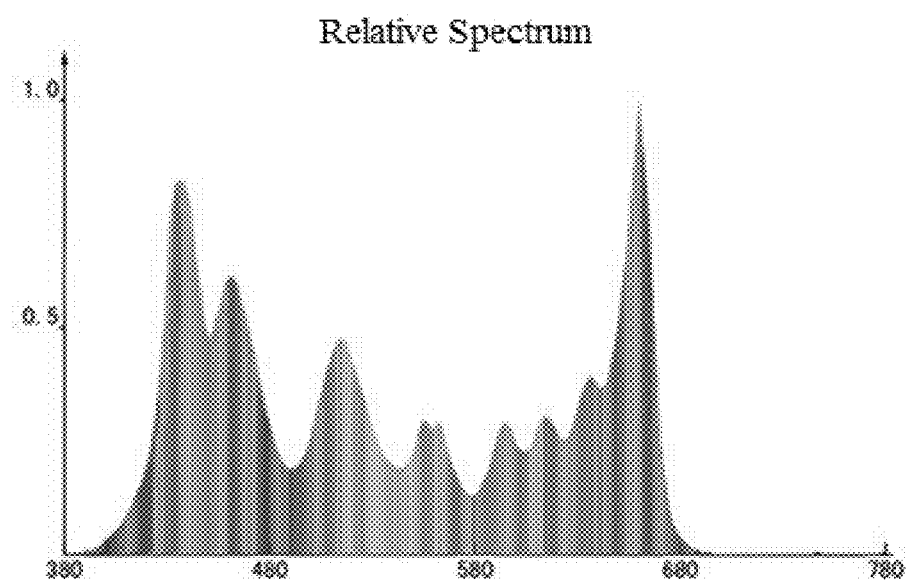
FIG. 6 is a diagram of the quasi-solar LED spectrum suitable for the plants growth of the quasi-solar spectrum LED lamp bead structure according to the embodiment shown in FIG. 4 of the present application.

Specifically, FIG. 6 is a diagram of the quasi-solar LED spectrogram suitable for the plants growth of the quasi-solar spectrum LED lamp bead structure according to the embodiment shown in FIG. 4 of the present application. Wherein, the present embodiment uses FMS-6000 light-color-electric comprehensive test system to conduct the spectrum test. It can be seen from FIG. 6 that the present embodiment can perfectly manufacture the quasi-solar spectrum LED lamp bead suitable for the growth of plants.

Figure 7:
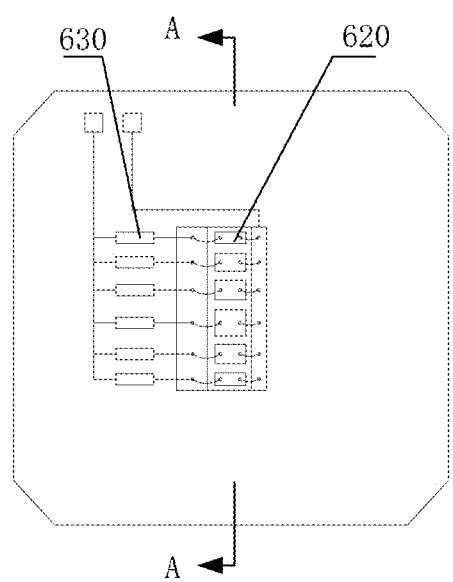
FIG. 7 is a top view of the quasi-solar spectrum LED lamp bead structure according to another embodiment of the present application.
Figure 8:
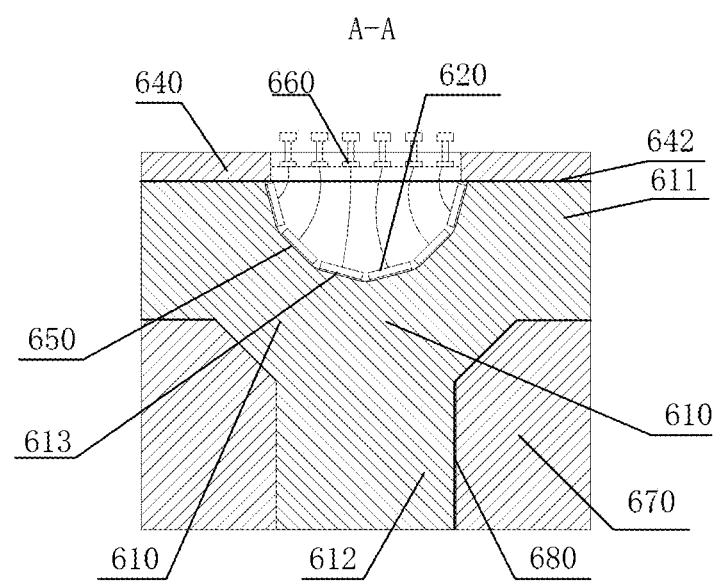
FIG. 8 is an A-A section view of the quasi-solar spectrum LED lamp bead structure according to the embodiment shown in FIG. 7 of the present application.

In addition, FIG. 7 is a top view of the quasi-solar spectrum LED lamp bead structure according to another embodiment of the present application; FIG. 8 is an A-A section view of the quasi-solar spectrum LED lamp bead structure according to the embodiment shown in FIG. 7. As shown in FIG. 7 and FIG. 8, the quasi-solar spectrum LED lamp bead structure of the present embodiment includes a negative electrode 610 for three-dimensional integrated encapsulation, 6 LED chips 620, a PCB board 640 of a stepped structure for three-dimensional integrated encapsulation, 6 resistors 630 and heat sinks 670.

In order to provide a quasi-solar LED spectrum that can alleviate visual fatigue and prevent myopia, the first polarity electrode (such as negative electrode) 610 for three-dimensional integrated encapsulation of the quasi-solar spectrum LED lamp bead structure of the present embodiment is designed to be a structure based on a semi-cylindrical surface, and adopts 6 LED chips having different wave lengths.

For example, the wave lengths, powers and sizes of the 6 LED chips with different specifications of the present embodiment, the coating size of the corresponding solder paste (or conductive adhesive), the sizes of the encapsulation rectangular grooves 613 machined on the negative electrode 610, and the plurality of corresponding resistors are shown in the following table II.

TABLE II

Design Parameters of the Quasi-solar Spectrum LED Lamp Bead Structure
That Alleviates Visual Fatigue and Prevent Myopia

| LED | LED21 | LED22 | LED23 | LED24 | LED25 | LED26 |
|---|---|---|---|---|---|---|
| Wave length (nm) | 458 | 510 | 552 | 586 | 604 | 627 |
| Power (W) | 0.5 | 0.2 | 0.5 | 0.2 | 0.5 | 0.2 |
| Size (mm) | 0.931 * 0.931 | 0.49 * 0.49 | 0.931 * 0.931 | 0.49 * 0.49 | 0.931 * 0.931 | 0.3675 * 0.735 |
| Solder paste (or conductive adhesive)-coated groove number | 1 | 2 | 3 | 4 | 5 | 6 |
| Solder paste (or conductive adhesive) coating size (mm) | 0.931 * 0.931 | 0.49 * 0.49 | 0.931 * 0.931 | 0.49 * .049 | 0.931 * 0.931 | 0.367 * 0.73 |
| Encapsulation groove number | 1 | 2 | 3 | 4 | 5 | 6 |
| Encapsulation groove size (mm) | 0.937 * 0.937 | 0.495 * 0.495 | 0.937 * 0.937 | 0.495 * 0.495 | 0.937 * 0.937 | 0.372 * 0.740 |
| Resistor | R21 | R22 | R23 | R24 | R25 | R26 |

The sizes of the 6 LED chips are smaller than (1×1) mm², therefore the 6 encapsulation planes are based on L+M=1 mm, the negative electrode 610 is designed to be a structure based on a semi-cylindrical surface, and the radius of the semi-cylindrical surface is 1.932 mm, calculated according to the following Equation (2). Wherein the cylindrical radius equation on the design basis of the semi-cylindrical surface is as follows:

$$Ra = \frac{1}{2}(L+M)/\sin\frac{90°}{n} \qquad (2)$$

Wherein Ra is the cylindrical radius on the design basis of the semi-cylindrical surface; L is the side size of the LED chip; M is the interval between two adjacent LED chips; n is the number of the LED chips.

In addition, the negative electrode 610 of the present embodiment may be designed to include 6 planes, and to be provided with 6 encapsulation rectangular grooves 613 with the center points of the 6 planes as the centers.

Preferably, the depth of the encapsulation rectangular groove 613 is slightly smaller than the depth sum of the solder paste (or conductive adhesive) 650 and the LED chip, and the length and width sizes of the 6 encapsulation rectangular grooves are (slightly) greater than the size of the accommodated LED chip and the coating size of the solder paste (or conductive adhesive). The connecting lines of the center points of the bottom planes of the 6 encapsulation rectangular grooves with the circle center of the semi-cylindrical surface are respectively perpendicular to the bottom plane of the corresponding encapsulation rectangular groove.

Meanwhile, the negative electrode 610 for three-dimensional integrated encapsulation is further provided with a flange plate (a square flange plate is preferred) 611 for encapsulation, positioning and heat dissipation, and a cylindrical body 612.

The material of the first polarity negative electrode 610 is metal copper (or PCB or ceramic or carborundum).

Preferably, when the power of the LED chip is small, the negative electrode 610 for three-dimensional integrated encapsulation may not be provided with the cylindrical body, and the heat sink is not required.

In addition, the solder paste (or conductive adhesive) 650 is coated in the corresponding 6 encapsulation rectangular grooves 613 on the negative electrode according to the designed size and width. The 6 pieces of coated solder paste (or conductive adhesive) 650 are mounted with 6 LED chips 620 matching the shapes thereof. The lighting planes of the 6 LED chips face the circle center of the semi-cylindrical surface, and the connecting lines of the center points of the lighting planes of the 6 LED chips with the circle center (intersection point) of the semi-cylindrical surface are respectively perpendicular to the corresponding LED lighting planes, so as to be machined by heating to solder.

Similar to the embodiment shown in FIG. 1, the PCB board 640 of the stepped structure is bonded to the flange plate 611 of the negative electrode 610 for three-dimensional integrated encapsulation through adhesive 642. The PCB board 640 has rectangular through holes having a stepped structure, wherein the shape and position of the through hole are designed under a principle that the light emitted by the LED chips 620 is not blocked from continuing to illuminate outwards after being focused and mixed at the intersection point.

The 6 resistors R21-R26 are encapsulated on the first stepped surface of the PCB board, one ends of the 6 resistors are jointly connected to the positive pole of the power source, and the other ends of the 6 resistors are respectively conducted to the soldering points 660 on the second stepped surface of the PCB board; the soldering points 660 are respectively connected to the positive poles of the lighting planes of the corresponding LED chips.

And the negative poles (on the lighting plane or on the substrate) of the 6 LED chips are connected to the negative electrode 610 for three-dimensional integrated encapsulation.

Preferably, the heat sink 670 is sleeved on the cylindrical body 612 of the negative electrode 610 for three-dimensional encapsulation, and thermally conductive adhesive 680 are used between the heat sink 670 and the flange plate 611 as well as between the heat sink 670 and the cylindrical body 612, for adhesion.

In addition, the connecting lines of the LED chips with the negative electrode for three-dimensional integrated encapsulation, the connecting lines of the LED chips with the soldering points on the second stepped of the PCB board, and the soldering points are fixed by pouring AB glue, wherein the AB glue may be arranged to fill until the horizontal position of the first stepped surface of the PCB board for heating and solidification.

In addition, after connecting the circuit and turning on the power, the light of 6 different colors emitted by the LED chips LED21-LED26 having 6 different wave lengths is focused and mixed at the circle center of the semi-cylindrical surface to form a fan-shaped surface light source.

By adjusting the resistance values of the resistors R21-R26 respectively, the currents passing LED21-LED26 can be changed correspondingly, thereby changing the ratios of the 6 kinds of light in the mixed light and obtaining the quasi-solar spectrum that can alleviate visual fatigue and prevent myopia.

Figure 9:
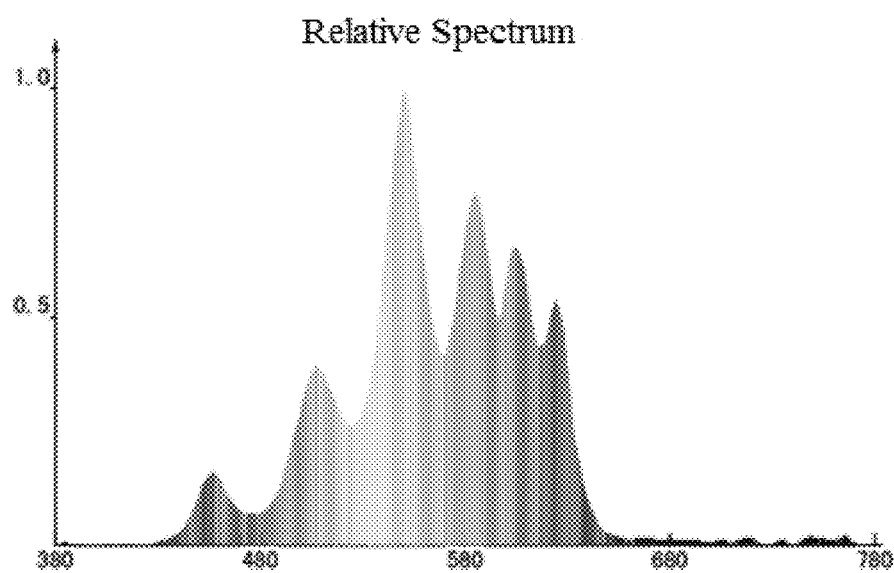
FIG. 9 is a spectrum diagram of the quasi-solar spectrum LED lamp bead structure that can alleviate visual fatigue and prevent myopia according to the embodiment shown in FIG. 7 of the present application.

Specifically, FIG. 9 is a spectrum diagram of the quasi-solar spectrum LED lamp bead structure that can alleviate visual fatigue and prevent myopia according to the embodiment shown in FIG. 7 of the present application. Wherein, the present embodiment uses FMS-6000 light-color-electric comprehensive test system to conduct the spectrum test.

It can be seen from FIG. 9 that, the spectrum of the quasi-solar spectrum LED lamp bead structure of the present embodiment has a main peak wave length minimum value of 535 nm, a main peak wave length maximum value of 565 nm, a main peak wave length central value of 550 nm; a wave band radiation flux of wave lengths 520 nm-580 nm is 37% greater than that of wave lengths 380 nm-780 nm; a wave band radiation flux of wave lengths 380 nm-480 nm is 25% smaller than that of wave lengths 380 nm-780 nm. Therefore, the present embodiment can manufacture a quasi-solar spectrum LED lamp bead that can prevent myopia.

It should be noted that, in the description of the present application, the orientation or position relations indicated by the terms "circle center", "sphere center", "center", "upper", "lower", "semi-cylindrical surface", "hemispherical surface", "interval", "first stepped", "second stepped", "groove", "blind hole", "conduct", "connect", "bond", "fix", "first polarity", "second polarity", etc. are based on the orientation and position relations shown in the drawings, which is merely for the convenience of describing the present application and simplifying the description, and is not to indicate or imply that the referred device or component must have a specific shape, a structure having the specific shape and a specific operation. Therefore it cannot be construed as limiting the present application. A "plane" may be a square plane, a rectangular plane, or a plane of other shapes, depending on the shape of the selected chip. Unless specifically defined and described otherwise, the terms "mount" "encapsulate", "connect", "turn on", "conduct", "machine" and "manufacture" are to be construed broadly. For example, a connection may be a mechanical connection or an electrical connection; it may be a direct connection or an indirect connection via an intermediate medium, or it may be an internal connection of two components. For a person of ordinary skill in the art, the specific meanings of the terms above in the present application can be understood according to specific situations. In the description of the present application, unless specified otherwise, "a plurality of" means two or more.

The apparatus embodiments described above are only illustrative, in which the modules described as separate parts may be or may not be physically separated, and the parts displayed as modules may be or may not be physical modules, that is, they may be located in one place, or may also be distributed to multiple network modules. According to actual needs, some or all of the modules may be selected to achieve the objects of the solutions of the embodiments. Those of ordinary skill in the art can understand and implement without creative work.

Through the description of the embodiments above, those skilled in the art can clearly understand that each embodiment can be implemented by means of software with necessary universal hardware platform, and can also, of course, by means of hardware. Based on such understanding, the technical solutions of the present application, or the part thereof contributing to the prior art can be embodied in the form of a software product stored in a computer-readable storage medium, such as ROM/RAM, magnetic disk, optical disk, etc. The software product includes certain instructions so that a computer device (may be a personal computer, a server, or a network device, etc.) performs each of the embodiments, or some parts of the embodiments.

Finally, it should be noted that the embodiments above are only used to illustrate rather than to limit the technical solutions of the present application; although the present application has been described in detail with reference to the foregoing embodiments, those of ordinary skills in the art should understand that they can still modify the technical solutions described in the foregoing embodiments, or equivalently replace some of the technical features therein; and these modifications or replacements do not separate the essence of the corresponding technical solutions from the spirit and scope of the technical solutions of each of the embodiments of the present application.

What is claimed is:

1. A quasi-solar spectrum LED lamp bead structure, comprising a first polarity electrode, a plurality of LED chips, a plurality of resistors and a circuit board;
   wherein the first polarity electrode cooperates with the circuit board for encapsulating the plurality of LED chips and the plurality of resistors;
   the first polarity electrode is a three-dimensional structure comprising a plurality of planes;
   each of the LED chips is respectively mounted on a corresponding plane; one end of each of the resistors is connected to a corresponding soldering point on the circuit board, and each of the soldering points is connected to a pole on a lighting plane of the corresponding LED chip; the other end of each of the resistors is connected to a second polarity electrode which is on the circuit board; the other pole of the LED chip is connected to the first polarity electrode;
   wherein the first polarity electrode and the second polarity electrode have opposite polarities, and the resistors are variable resistors or fixed resistors;
   the first polarity electrode is a structure based on a semi-cylindrical surface, and has the plurality of planes thereon; a connecting line of a center point of each of the planes with a circle center of the semi-cylindrical surface is respectively perpendicular to each of the corresponding planes; or,
   the first polarity electrode is a structure based on a hemispherical surface, and has the plurality of planes thereon; two apex angles below the plurality of planes are connected to each other to form a regular polygon, a plane where the regular polygon is located is parallel to a plane of the hemispherical surface, and the two apex angles below each of the planes are both located on the hemispherical surface, two apex angles above the plurality of planes are both on a spherical surface of the plane of the hemispherical surface intersecting the hemispherical surface;

connecting lines of center points of the plurality of planes with a sphere center of the hemispherical surface are respectively perpendicular to each of the corresponding planes; or, the first polarity electrode is an arbitrary-shaped three-dimensional structure comprising the plurality of planes; the arbitrarily-shaped three-dimensional structure is an arbitrarily structure that does not block light emitted by the LEDs on the planes from continuing to illuminate outwards after being focused and mixed at an intersection point, and is neither a semi-cylindrical surface design structure nor a hemispherical surface design structure; connecting lines of center points of the plurality of planes with the intersection point are respectively perpendicular to the corresponding planes.

2. The quasi-solar spectrum LED lamp bead structure of claim 1, wherein a region of the first polarity electrode surrounding the lighting plane of the LED chip is provided with a polygonal flange plate;
a material of the first polarity electrode is metal;
the circuit board is arranged on the flange plate, and is connected to the flange plate through an adhesive.

3. The quasi-solar spectrum LED lamp bead structure of claim 1, wherein the other end of the lighting plane of the LED chip of the first polarity electrode is provided with a cylindrical body;
the cylindrical body is sleeved with a heat sink, and thermally conductive adhesives are provided between the cylindrical body and the heat sink and between the flange plate and the heat sink.

4. The quasi-solar spectrum LED lamp bead structure of claim 1, further comprises a plurality of soldering pieces;
each of the soldering pieces is respectively mounted on one of the corresponding planes; each of the LED chips is respectively mounted on one of the corresponding soldering pieces.

5. The quasi-solar spectrum LED lamp bead structure of claim 4, wherein a central portion of each of the planes of the first polarity electrode is provided with a encapsulation groove for accommodating the soldering piece and the LED chip, and a depth of the encapsulation groove is greater than or equal to a thicknesses sum of the soldering piece and the LED chip, a size of the encapsulation groove is greater than a size of the LED chip and a size of the soldering piece;
when the first polarity electrode is the structure based on the semi-cylindrical surface, a connecting line of a center point of a bottom plane of the encapsulation groove with a circle center of a semi-cylindrical surface of the first polarity electrode is perpendicular to the bottom plane of the encapsulation groove;
when the first polarity electrode is the structure based on the hemispherical surface, a connecting line of the center point of the bottom plane of the encapsulation groove with a sphere center of a hemispherical surface is perpendicular to the bottom plane of the encapsulation groove;
when the first polarity electrode is the arbitrary-shaped three-dimensional structure, a connecting line of the center point of the bottom plane of the encapsulation groove with the intersection point is perpendicular to the bottom plane of the encapsulation groove;
wherein the soldering pieces and the LED chips are sequentially mounted in the encapsulation groove.

6. The quasi-solar spectrum LED lamp bead structure of claim 4, wherein a central portion of each of the planes of the first polarity electrode is provided with an encapsulation blind hole for accommodating the soldering piece and the LED chip, and a depth of the encapsulation blind hole is smaller than or equal to a thicknesses sum of the soldering piece and the LED chip, a size of the encapsulation blind hole is greater than a size of the accommodated LED chip and a size of the accommodated soldering piece;
when the first polarity electrode is the structure based on the semi-cylindrical surface, a connecting line of a center point of a bottom plane of the encapsulation blind hole with the circle center of a semi-cylindrical surface of the first polarity electrode is perpendicular to the bottom plane of the encapsulation blind hole;
when the first polarity electrode is the structure based on the hemispherical surface, a connecting line of the center point of the bottom plane of the encapsulation blind hole with the sphere center of a hemispherical surface is perpendicular to the bottom plane of the encapsulation blind hole;
when the first polarity electrode is the arbitrary-shaped three-dimensional structure, a connecting line of the center point of the bottom plane of the encapsulation blind hole with the intersection point is perpendicular to the bottom plane of the encapsulation blind hole;
wherein the soldering piece and the LED chip are sequentially mounted in the encapsulation blind hole.

7. The quasi-solar spectrum LED lamp bead structure of claim 4, wherein a shape of the soldering piece is the same as a shape of the corresponding LED chip;
a size of the soldering piece is smaller, or equal to, or greater than a size of the corresponding LED chip.

8. The quasi-solar spectrum LED lamp bead structure of claim 1, wherein the circuit board is provided with a through hole having a stepped structure, or a notch having other predetermined shapes;
the plurality of resistors are located on a first stepped surface of the stepped structure of the circuit board, and the soldering points are located on a second stepped surface of the stepped structure of the circuit board.

9. The quasi-solar spectrum LED lamp bead structure of claim 8, wherein it further comprises a multi-component adhesive;
the multi-component adhesive is configured to heat and solidify the connecting line of the LED chip with the first polarity electrode, the connecting line of the LED chip with the soldering point on the second stepped surface of the circuit board, and the soldering point;
the multi-component adhesive is filled to a horizontal position that does not exceed a first stepped surface of the circuit board.

10. The quasi-solar spectrum LED lamp bead structure of claim 1, wherein light of multiple colors emitted by the plurality of LED chips is focused and mixed at an intersection point to generate a spectrogram of a quasi-solar spectrum LED lamp bead that can alleviate visual fatigue and prevent myopia; in the spectrogram, a main peak wave length minimum value is 535 nm, a main peak wave length maximum value is 565 nm, and a main peak wave length central value is 550 nm; a wave band radiation flux of wave lengths 520 nm-580 nm is 37% greater than that of wave lengths 380 nm-780 nm; a wave band radiation flux of wave lengths 380 nm-480 nm is 25% smaller than that of wave lengths 380 nm-780 nm.

* * * * *